United States Patent
Ma et al.

(10) Patent No.: US 12,261,067 B2
(45) Date of Patent: Mar. 25, 2025

(54) WAFER CLEANING APPARATUS AND WAFER TRANSFER DEVICE

(71) Applicant: BEIJING NAURA MICROELECTRONICS EQUIPMENT CO., LTD., Beijing (CN)

(72) Inventors: Hongshuai Ma, Beijing (CN); Hongyu Zhao, Beijing (CN); Ruiting Wang, Beijing (CN)

(73) Assignee: BEIJING NAURA MICROELECTRONICS EQUIPMENT CO., LTD., Beijing (CN)

(*) Notice: Subject to any disclaimer, the term of this patent is extended or adjusted under 35 U.S.C. 154(b) by 0 days.

(21) Appl. No.: 18/574,817

(22) PCT Filed: Jun. 23, 2022

(86) PCT No.: PCT/CN2022/100693
§ 371 (c)(1),
(2) Date: Dec. 28, 2023

(87) PCT Pub. No.: WO2023/274008
PCT Pub. Date: Jan. 5, 2023

(65) Prior Publication Data
US 2024/0420977 A1    Dec. 19, 2024

(30) Foreign Application Priority Data
Jun. 29, 2021  (CN) .......................... 202110730089.7

(51) Int. Cl.
*H01L 21/67* (2006.01)
*H01L 21/673* (2006.01)

(52) U.S. Cl.
CPC .. *H01L 21/67309* (2013.01); *H01L 21/67346* (2013.01); *H01L 21/67028* (2013.01)

(58) Field of Classification Search
CPC ................................................. H01L 21/67346
See application file for complete search history.

(56) References Cited

U.S. PATENT DOCUMENTS

| 9,245,784 B2 * | 1/2016 | Hashimoto | ....... H01L 21/68707 |
| 2014/0210224 A1 * | 7/2014 | Hashimoto | ........... H01L 21/677 |
| | | | 901/30 |

FOREIGN PATENT DOCUMENTS

| CN | 206380193 U | 8/2017 |
| CN | 209903236 U | 1/2020 |

(Continued)

OTHER PUBLICATIONS

The World Intellectual Property Organization (WIPO) International Search Report for PCT /CN2022/100693 Aug. 24, 2022 5 Pages (including translation).

*Primary Examiner* — Gerald McClain
(74) *Attorney, Agent, or Firm* — ANOVA LAW GROUP, PLLC

(57) ABSTRACT

A wafer cleaning apparatus and a wafer transfer device. The wafer transfer device includes a machine bracket, a drive mechanism, a retractable bracket, and a plurality of wafer support brackets. The drive mechanism and the retractable bracket are arranged at the machine bracket. An end of the retractable bracket is fixedly connected to the machine bracket. The second end of the retractable bracket is movably arranged at the machine bracket and arranged along the movement direction of the second end. The drive mechanism is connected to the retractable bracket and is configured to drive the second end to move to cause the retractable bracket to retract. The plurality of wafer support brackets are arranged at the retractable bracket. The distance between (Continued)

any two neighboring wafer support brackets changes as the retractable bracket extends and retracts.

11 Claims, 7 Drawing Sheets

(56) References Cited

FOREIGN PATENT DOCUMENTS

| | | | |
|---|---|---|---|
| CN | 112349639 A | | 2/2021 |
| CN | 113471122 A | | 10/2021 |
| JP | 01191439 A | * | 8/1989 |
| JP | 03209845 A | * | 9/1991 |
| JP | H03209845 A | | 9/1991 |
| JP | 04030552 A | * | 2/1992 |
| JP | H0430552 A | | 2/1992 |
| JP | 2001210696 A | * | 8/2001 |
| JP | 2002164413 A | * | 6/2002 |
| JP | 2005285799 A | | 10/2005 |
| JP | 2006313865 A | * | 11/2006 |
| JP | 2009260252 A | * | 11/2009 |
| JP | 2013135099 A | * | 7/2013 ......... B25J 15/0052 |
| KR | 20050015243 A | | 2/2005 |

* cited by examiner

WAFER CLEANING APPARATUS AND WAFER TRANSFER DEVICE

CROSS-REFERENCE TO RELATED APPLICATIONS

This application is a national phase entry under 35 U.S.C. § 371 of International Application No. PCT/CN2022/100693, filed on Jun. 23, 2022, which claims priority to Chinese Application No. 202110730089.7 filed on Jun. 29, 2021, the entire contents of both of which are incorporated herein by reference.

TECHNICAL FIELD

The present disclosure generally relates to the semiconductor field and, more particularly, to a wafer cleaning apparatus and a wafer transfer device.

BACKGROUND

In the process of continuous processing, forming, and polishing, contaminants are generated at a wafer since the wafer is in contact with organic materials, particles, and metals. Thus, a cleaning process needs to be performed on the surface of the wafer to eliminate the contaminants on the surface of the wafer. The cleaning process is an important step in the wafer manufacturing process.

During the cleaning process, the wafer needs to be fetched from a wafer storage container using a wafer transfer device and placed in a cleaning tank in a misalignment sealed insertion method for cleaning. Once the cleaning is completed, the wafer is then fetched from the cleaning tank and placed back into the wafer storage container. As the number of stacked memory chip layers increases, the thickness of the wafer also increases. Thus, the wafer is thicker when the same number of wafers are placed in the cleaning tank. The distance between neighboring wafers is reduced accordingly, which impacts the cleaning effect.

SUMMARY

The present disclosure provides a wafer cleaning apparatus and a wafer transfer device, which can adjust a distance between any two neighboring wafers to adapt to wafers of different thicknesses to ensure the cleaning effect.

To solve the above problem, the present disclosure provides the following technical solutions.

According to a first aspect, the present disclosure provides the wafer transfer device of the wafer cleaning apparatus, including a machine bracket, a drive mechanism, a retractable bracket, and a plurality of wafer support brackets, wherein:

the drive mechanism and the retractable bracket are arranged at the machine bracket, a first end of the retractable bracket is fixedly connected to the machine bracket, a second end of the retractable bracket is movably arranged at the machine bracket, the drive mechanism is connected to the retractable bracket and configured to drive the second end to move to cause the retractable bracket to extend and retract, the plurality of wafer support brackets are arranged at the retractable bracket and arranged in a movement direction of the second end, and a distance of any two neighboring wafer support brackets changes as the retractable bracket extends and retracts, and the distance of any two neighboring wafer support brackets is same.

According to the second aspect, the present disclosure further provides wafer cleaning apparatus. The wafer cleaning apparatus includes the wafer transfer device of the first aspect.

The technical solution of the present disclosure can have the following beneficial effects.

In embodiments of the present disclosure, by fixing the first end of the retractable bracket to the machine bracket, the drive mechanism can be connected to the retractable bracket. Thus, the drive mechanism can drive the second end to move to cause the retractable bracket to extend and retract as the second end moves. Since the wafer support brackets are evenly spaced at the retractable bracket, the distance between any two neighboring wafer support brackets can change as the retractable bracket extends and retracts and the same. Thus, the distance between any two neighboring wafers arranged at the wafer support brackets can change and be the same. That is, the distance between any two neighboring wafers can be adjusted to adapt to wafers of different thicknesses to ensure the cleaning effect.

BRIEF DESCRIPTION OF THE DRAWINGS

The accompanying drawings described here are used to provide further understanding of the present disclosure and constitute a part of the present disclosure. Exemplary embodiments of the present disclosure are used to explain the present disclosure and do not limit the present disclosure.

REFERENCE NUMERALS

Figure 1:
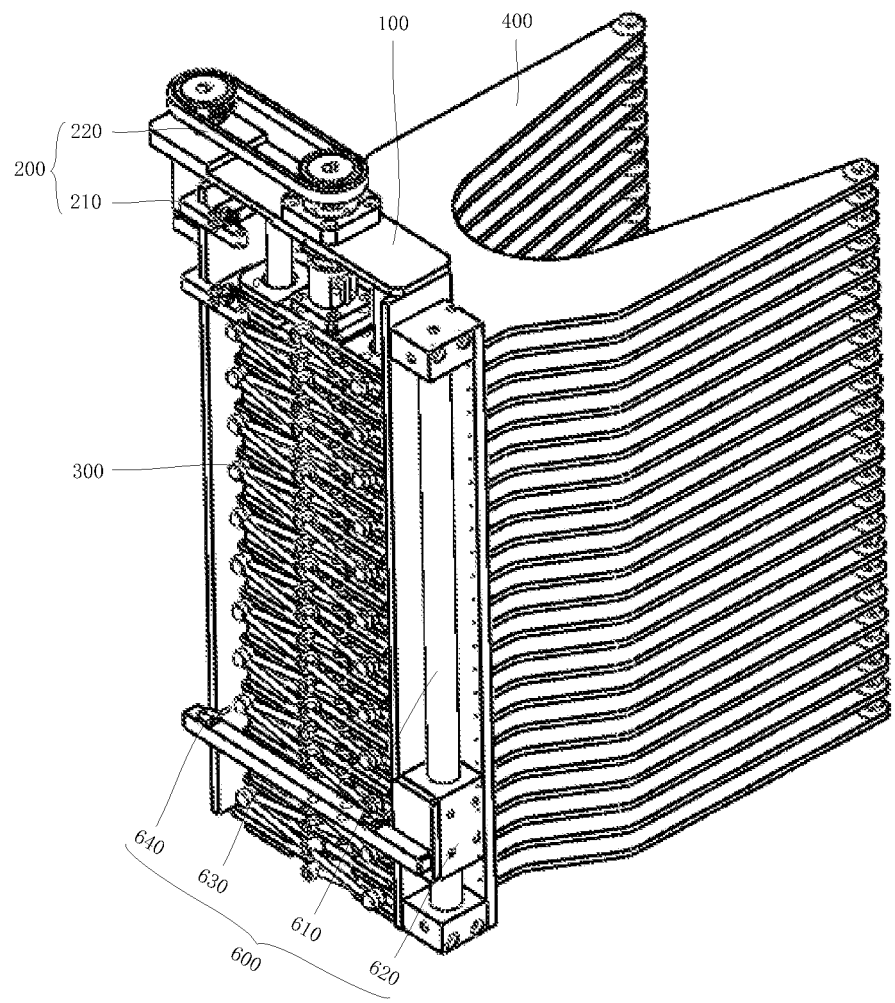
FIG. 1 illustrates a schematic structural diagram of a wafer transfer device according to an embodiment of the present disclosure.
Figure 2:
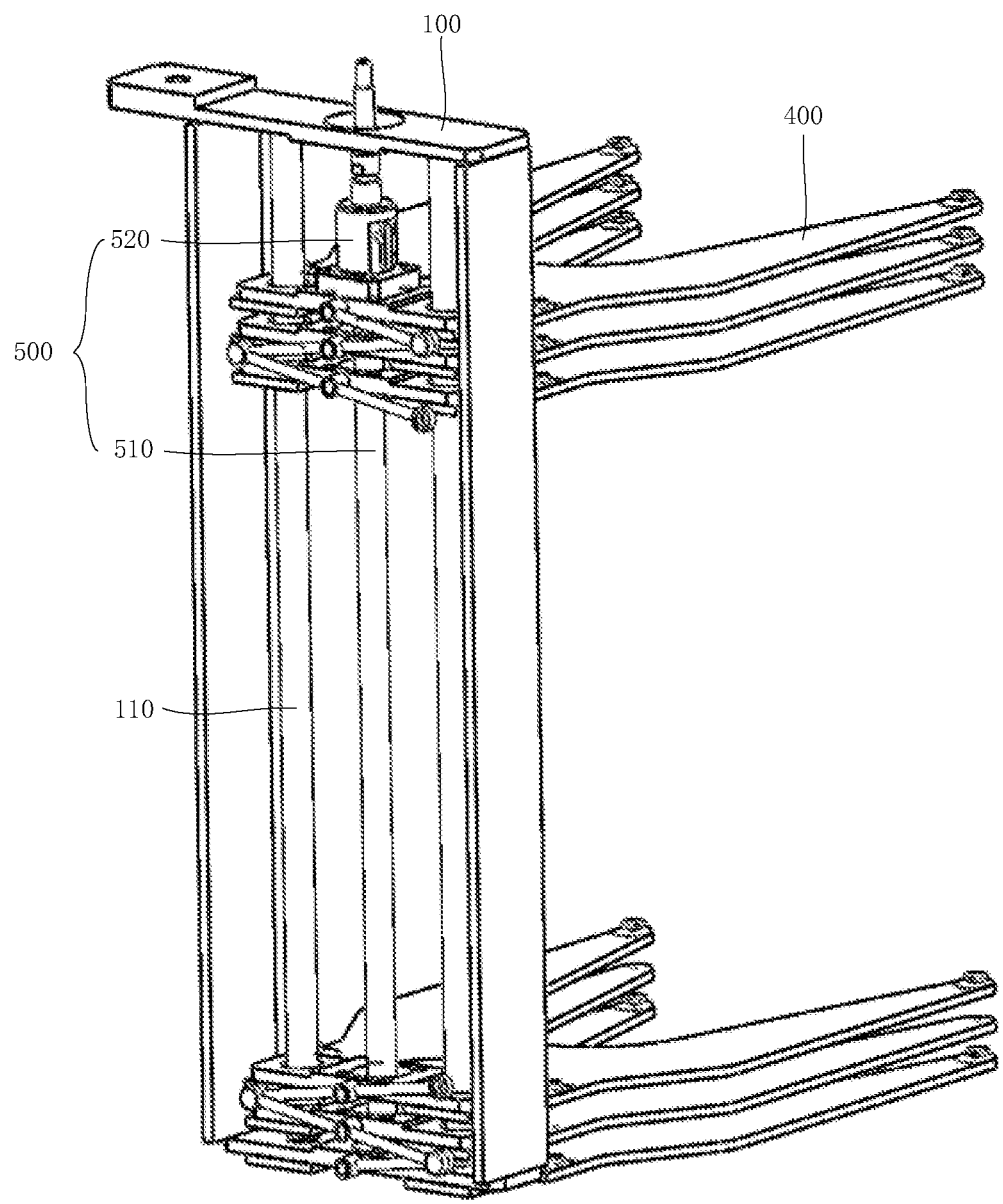
FIG. 2 illustrates a schematic local cross section diagram of a wafer transfer device according to an embodiment of the present disclosure.
Figure 3:
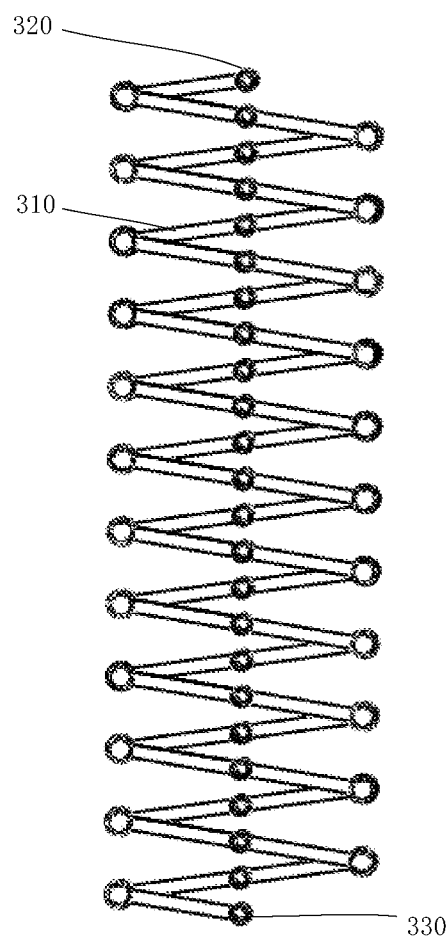
FIG. 3 illustrates a schematic structural diagram of a retractable bracket according to an embodiment of the present disclosure.

100 Machine bracket 110 Guide rod
200 Drive mechanism 210 Motor 220 Transmission member
300 Retractable bracket 310 Connection rod 320 Second end 330 First end 340 Sleeve
400 Wafer support bracket 410 First wafer positioning member 420 Second wafer positioning member 430 Avoid hole 440 Guide hole 450 Bracket pin 460 Shaft sleeve
500 Screw mechanism 510 Screw 520 Sliding piece
600 Distance measurement structure 610 Electric cylinder 620 Electric cylinder sliding piece 630 Through-beam sensor bracket 640 Through-beam sensor
700 Wafer
800 Wafer storage container

DETAILED DESCRIPTION OF THE EMBODIMENTS

To make the objectives, technical solutions, and advantages of the present disclosure clearer, the technical solutions of the present disclosure are described in detail in connection with embodiments and accompanying drawings of the present disclosure. Apparently, described embodiments are merely some embodiments of the present disclosure not all embodiments. Based on embodiments of the present disclosure, all other embodiments obtained by those of ordinary skill in the art without creative efforts are within the scope of the present disclosure.

The technical solutions of embodiments of the present disclosure are described in detail in connection with the accompanying drawings.

Referring to FIGS. 1 to 7, the present disclosure provides a wafer transfer device for a wafer cleaning apparatus, which is configured to fetch a wafer 700 from a wafer storage container 800 and transfer the wafer 700 to a cleaning tank or fetch the wafer 700 from the cleaning tank and transfer the wafer 700 to the wafer storage container 800. The wafer transfer device includes a machine bracket 100, a drive mechanism 200, a retractable bracket 300, and a plurality of wafer support brackets 400.

Machine bracket 100 serves as a foundation for installing various members of the wafer transfer device. The drive mechanism 200 and the retractable bracket 300 are installed at the machine bracket 100.

The retractable bracket 300 has a retractable function and includes a first end 330 and a second end 320. The first end 330 can be fixedly connected to the machine bracket 100, for example, through a threaded connection or a pin connection. The second end 320 is movably arranged at the machine bracket. For example, a guide rail is arranged at machine bracket 100. The second end 320 can be a connection member slidingly cooperated with the guide rail. The second end 320 can also have a roller or ball structure. A sliding track cooperating with the roller or ball is arranged at machine bracket 100. The roller or ball can roll in the sliding track to cause the second end 320 to move. When the second end 320 moves, the retractable bracket 300 can expand and retract. The retractable bracket 300 can be formed by hinging the rod structures end-to-end in sequence. The retractable bracket 300 can also be a retractable spring structure.

The drive mechanism 200 can be a mechanism that drives the retractable bracket 300 to expand and retract. The drive mechanism 200 can be fixedly mounted at the machine bracket 100. The drive mechanism 200 can be connected to the retractable bracket 300. For example, the drive mechanism 200 can be connected to the second end 320. The drive mechanism 200 can be configured to drive the second end 320 to move to cause the retractable bracket 300 to expand and retract. The drive mechanism 200 can be a linear motor, a hydraulic retractable member, an air pressure retractable member, and a shape memory alloy member. The types of the drive mechanism 200 are not limited in embodiments of the present disclosure.

The wafer support bracket 400 can be a carrier member for the wafer 700. When the wafer 700 is transferred between the wafer storage container 800 to the cleaning tank, the wafer 700 can be arranged on the wafer support bracket 400. A plurality of wafer support brackets 400 can be provided. For example, 25 wafer support brackets 400 can be provided. The plurality of wafer support brackets 400 can be arranged along the movement direction of the second end 320. Each wafer support bracket 400 can be placed with a wafer 700. The wafer support bracket 400 can be arranged at the retractable bracket 300. The distance between any two neighboring wafer support brackets 400 can be changed as the retractable bracket 300 retracts and extends. The distance between any two neighboring wafer support brackets 400 can be the same.

In some embodiments, the drive mechanism 200 can be connected to the retractable bracket 300. The wafer support brackets 400 can be arranged at the retractable bracket 300, and the distance between any two neighboring wafer support brackets 400 can be the same. When the first end 330 is fixed at machine bracket 100, and the drive mechanism 200 drives the second end 320 to move, the retractable bracket 300 can extend and retract. Thus, the wafer support brackets 400 arranged at the retractable bracket 300 can move as the retractable bracket 300 extends and retracts, the distance between any two neighboring wafer support brackets 400 can change, and the distance between any two neighboring wafer support brackets 400 can be the same.

In embodiments of the present disclosure, by fixing the first end 330 of the retractable bracket 300 to the machine bracket 100, the drive mechanism 200 can be connected to the retractable bracket 300. Thus, the drive mechanism 200 can drive the second end 320 to move to cause the retractable bracket 300 to extend and retract as the second end 320 moves. Since the wafer support brackets 400 are evenly spaced at the retractable bracket 300, the distance between any two neighboring wafer support brackets 400 can change as the retractable bracket 300 extends and retracts and the same. Thus, the distance between any two neighboring wafers 700 arranged at the wafer support brackets 400 can change and be the same. That is, the distance between any two neighboring wafers can be adjusted to adapt to wafers of different thicknesses to ensure the cleaning effect.

Furthermore, the retractable bracket 300 can include a plurality of connection rods 310 hinged end-to-end. Middle positions of the plurality of connection rods 310 can be on a same straight line. The plurality of wafer support brackets 400 can be correspondingly connected to the middle positions of the plurality of connection rods one by one. The connection positions between the plurality of wafer support brackets 400 and the corresponding connection rods can be one the same straight line. The direction of the straight line can extend along the movement direction of the second end 320.

The retractable bracket 300 can also include a plurality of X-shaped structural members formed by hinging the middle positions of every two connection rods 310. Two ends of each X-shaped structural member of the plurality of X-shaped structural members are hinged end-to-end to form the retractable bracket 300. The plurality of wafer support brackets 400 are connected to the hinges at the middle positions of the connection rods 310 in a one-to-one correspondence.

By forming the retractable bracket 300 into the structure with the plurality of connection rods 310 hinged end-to-end in sequence, the plurality of wafer support brackets 400 can be connected to the middle positions of the connection rods 310 in a one-to-one correspondence. By causing the connection positions between the plurality of wafer support brackets 400 and the corresponding connection rods 310 to be on the same straight line, the direction of the straight line can extend along the movement direction of the second end 320. Thus, when the second end 320 of the retractable bracket 300 moves, the distance between any two neighboring wafer support brackets 400 can change and be the same. Moreover, the plurality of crossing structures (i.e., X-shaped structure members) can have a good deformation restriction, which is beneficial to improve the stability of the structure and the extension accuracy.

In some embodiments, the wafer transfer device also includes a screw mechanism 500. The screw mechanism 500 is arranged at the machine bracket 100. The screw mechanism 500 includes a screw 510 and a sliding piece 520. The screw 510 is connected to the machine bracket 100. An axial direction of the screw 510 can be consistent with the movement direction of the second end 320. The screw 510 can be movably arranged at the machine bracket. For example, the machine bracket 100 can include bearings, and the two ends of the screw 510 can be connected to the bearings and rotate relative to the machine bracket 100. Conical grooves can be arranged at two ends of the screw 510. Two mounting members cooperating with the conical grooves can be arranged at machine bracket 100. The conical grooves of the screw 510 can rotatably cooperate with the mounting members. Thus, the screw 510 can rotate relative to the machine bracket 100.

The sliding piece 520 can be arranged at the screw 510 and thread-cooperate with the screw 510. The screw 510 can be connected to the drive mechanism 200. The drive mechanism 200 can drive the screw 510 to rotate to cause the sliding piece 520 to move along the axial direction of the screw 510 at the screw 510. The sliding piece 520 can be connected to the second end 320. The second end 320 can move with the sliding piece 520 to cause the retractable bracket 300 to extend and retract.

With the screw mechanism 500, the drive mechanism 200 can be connected to the screw 510. Thus, the screw 510 can rotate when driven by the drive mechanism 200 to further cause the sliding piece 520 connected to the screw 510 to move at the screw 510. Eventually, the second end 320 connected to the sliding piece 520 can move together. Thus, the retractable bracket 300 can extend and retract. Meanwhile, since the screw 510 of the screw mechanism 500 rotates continuously, the driven precision of the movement can be further improved.

In some embodiments, the drive mechanism 200 includes a motor 210 and a transmission member 220. The motor is arranged at the machine bracket 100 and fixedly mounted at the machine bracket 100 through bolts. The motor 210 can transmit movement and be connected to the screw 510 through the transmission member 220 to drive the screw 510 to rotate. In some embodiments, the transmission member 220 can be a transmission belt, pulleys can be arranged at the output shaft of the motor 210 and the input shaft of the screw 510. The transmission belt can be connected to the pulleys at the output shaft of the motor 210 and the input shaft of the screw 510. Thus, with the movement transmission function of the transmission belt, the motor 210 can drive the screw 510 to rotate. Of course, the transmission member 220 can also be a toothed chain. A gear cooperating with the toothed chain can be arranged at the output shaft of the motor 210. A gear cooperating with the toothed chain can also be arranged at the input shaft of the screw 510. With the movement transmission function of the toothed chain, the motor 210 can drive the screw 510 to rotate.

With the motor 210 and the transmission member 220, the motor 210 can transmit movement and be connected to the screw 510 through the transmission member 220. Thus, the drive force of the motor 210 can be transmitted to the screw 510 to cause the screw 510 to rotate. Moreover, by setting the transmission member 220 as the transmission belt, the shock and vibration can be mitigated through the elasticity of the transmission belt. Thus, the transmission can be more stable. Meanwhile, the transmission belt can slip at the pulleys, which effectively prevents damages of other members cause by the motor 210 continuously transmit power through the transmission belt after the wafer support bracket 400 moves to the position.

In some embodiments, the machine bracket 100 further includes a guide rod 110. The guide rod 110 can be parallel to the screw 510. That is, the axis of the guide rod 110 can extend along the movement direction of the second end 320. A guide hole 440 is formed at the wafer support bracket 400. Guide hole 440 can be formed at the bottom of the wafer support brackets 400. The plurality of wafer support brackets 400 can be arranged at the guide rod 110 by passing the guide rod 110 through the guide holes 440. The guide rod 110 can slidably cooperate with the guide hole 440 in the movement direction of the second end 320. In some embodiments, the guide rod 110 can be cylindrical. Guide hole 440 can be a circular through-hole. The guide rod 110 can be fitted with the guide hole 440 with clearance to cause the guide rod 110 to slidingly cooperate with the guide hole 440.

By providing the guide rod 110 and the guide hole 440, the guide rod 110 can slidingly cooperate with the guide hole 440. Thus, the movement direction of the wafer support bracket 400 under the guidance of the guide rod 110 can be more accurate. The guide rod 110 can also restrict the angular change of the wafer support bracket 400 during movement.

Furthermore, two guide rods 110 can be provided. The two guide rods 110 can be arranged on two sides of the screw 510, respectively. Two guide holes 440 can be formed at the wafer support bracket 400. The two guide holes 440 can cooperate with the two guide rods 110 in a one-to-one correspondence.

By providing the two guide rods 110 and the two guide holes 440, the movement direction of the wafer support bracket 400 can be more accurate when the wafer support bracket 400 is guided-cooperated with the guide rods 110 through the guide holes 440 during movement. Meanwhile, through the cooperation between the two guide rods 110 and the two guide holes 440, the angular changes of the wafer support bracket 400 can be better restricted during movement. Of course, in some embodiments, a different number of guide rods 110 can be provided, or a guide structure of any other structures can be adopted, which is not limited in embodiments of the present disclosure.

In some embodiments, avoidance holes 430 are formed on the plurality of wafer support brackets 400. The screw 510 passes through the avoidance holes 430 of the plurality of wafer support brackets 400 to be connected to the machine bracket 100. In some embodiments, the avoidance holes 430 are arranged at the bottom of the wafer support brackets 400 and can be circular holes.

By providing the avoidance holes 430 on the wafer support brackets 400, the screw 510 can pass through the avoidance holes 430 to effectively solve the issue that the wafer support brackets 400 block the screw 510. Thus, the structure can be more compact.

Figure 4:
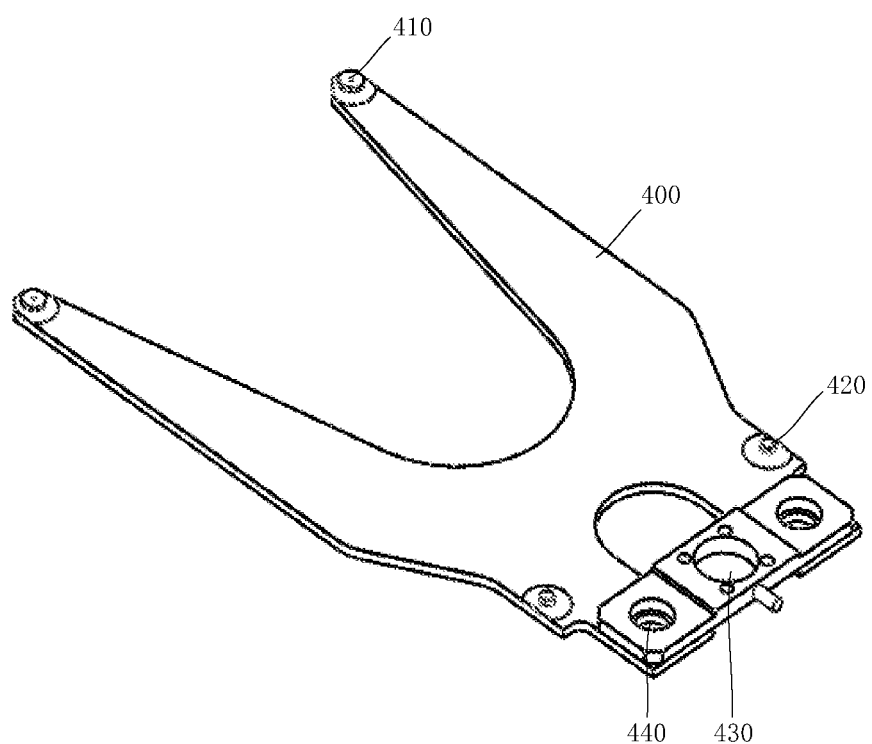
FIG. 4 illustrates a schematic structural diagram of a wafer support bracket according to an embodiment of the present disclosure.

As shown in FIG. 4, in some embodiments, the wafer support bracket 400 also includes first wafer positioning members 410 and second wafer positioning members 420. Two first wafer positioning members 410 and two second wafer positioning members 420 are provided. The first wafer positioning members 410 can be provided at front of the wafer support bracket 400. The second wafer propositioning members 420 can be provided at bottom of the wafer support bracket 400. The first wafer positioning members 410 and the second wafer positioning members 420 can be configured to fix the wafer 700 at the wafer support bracket 400 to stably position the wafer 700.

Figure 5:
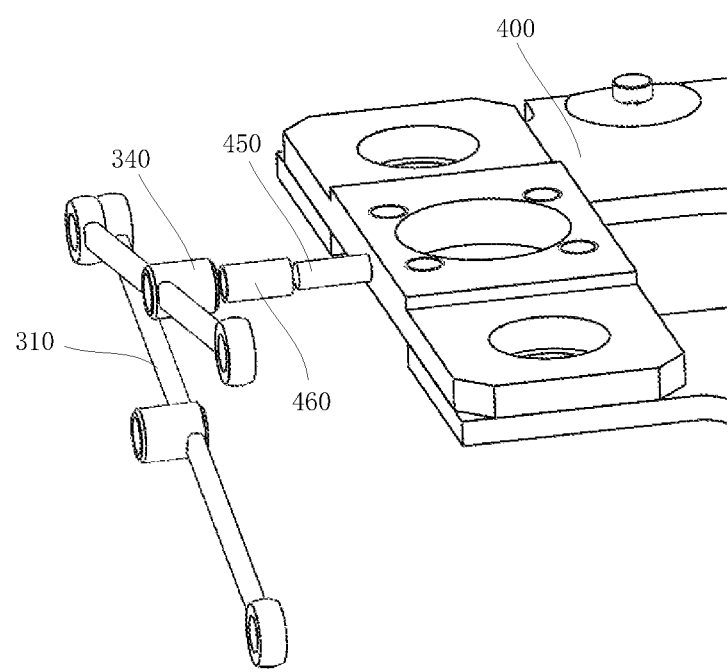
FIG. 5 illustrates a schematic diagram showing a connection between a wafer support bracket and a retractable bracket according to an embodiment of the present disclosure.
Figure 6:
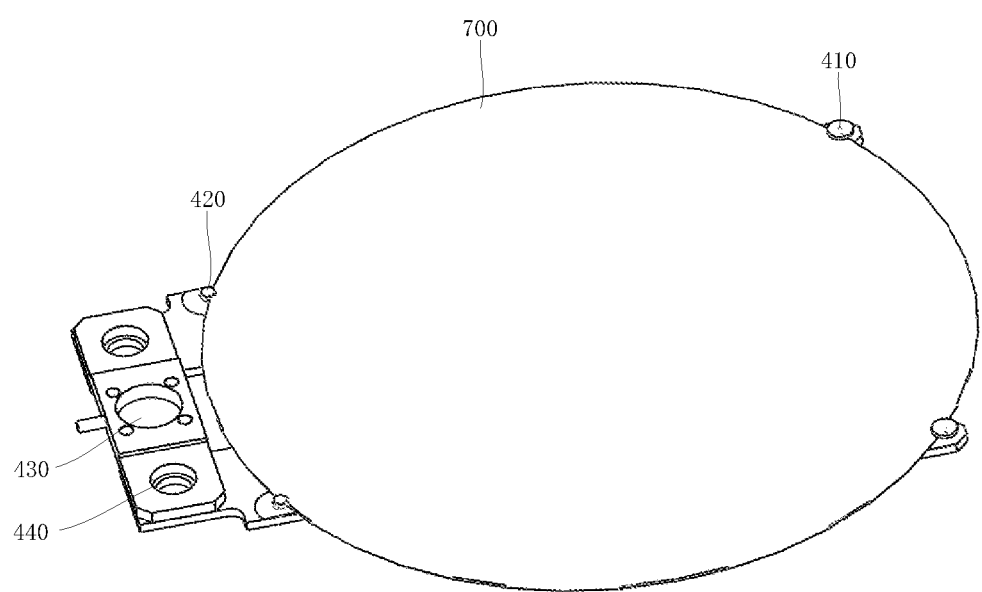
FIG. 6 illustrates a schematic diagram showing a wafer carried by a wafer support bracket according to an embodiment of the present disclosure.
Figure 7:
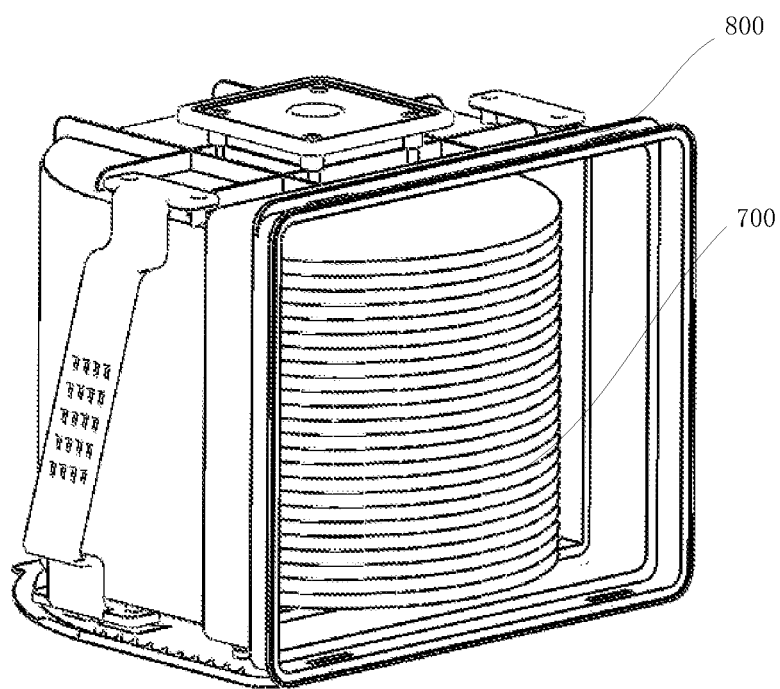
FIG. 7 illustrates a schematic diagram showing a wafer in a wafer storage container according to an embodiment of the present disclosure.

As shown in FIG. 5, in some embodiments, the wafer support bracket 400 also includes a bracket pin 450 and a shaft sleeve 460. The retractable bracket 300 includes a sleeve 340. Bracket pin 450 is fixedly mounted at an end of the wafer support bracket 400. The shaft sleeve 460 can be rotatably connected at the bracket pin 450. The shaft sleeve 460 can be connected to the sleeve 340 with an interference fit. The sleeve 340 can be fixedly mounted at the retractable bracket 300. The wafer support bracket 400 can cooperatively connected to the sleeve 340 through the shaft sleeve 460.

By arranging the bracket pin 450 at the wafer support bracket 400, the shaft sleeve 460 can be rotatably connected to the bracket pin 450. Thus, during the movement, the angle of the wafer support bracket 400 can be adjusted through the guidance of the guide rod 110, which effectively solves the issue that the angular adjustment of the wafer support bracket 400 during the movement. By providing the sleeve 340 at the retractable bracket 300, the shaft sleeve 460 can be connected to the sleeve 340 in the interference fit to effectively solve the connection issue between the wafer support bracket 400 and the retractable bracket 300.

In some embodiments, the machine bracket 100 can further include a first position sensor and a second position sensor. The first position sensor and the second position sensor can be spaced apart at machine bracket 100. In some embodiments, the first position sensor can be arranged at a position where the second end 320 moves to the first position. The second position sensor can be arranged at a position where the second end 320 moves to the second position.

When the second end 320 moves to the position opposite the first position sensor, the first position sensor can be triggered. The distance between any two neighboring wafer support brackets 400 can have a first distance. When the second end 320 moves to the position opposite the second position sensor, the second position sensor can be triggered. The distance between any two neighboring wafer support brackets 400 can be the second distance. The first distance and the second distance are not the same. In some embodiments, the first position sensor and the second position sensor can be limit switches or photoelectric sensors.

In some embodiments, the wafer transfer device can also include a distance measurement structure 600. The distance measurement structure 600 can be arranged at the machine bracket 100. The distance measurement structure 600 can be configured to measure the distance between the wafers 700 carried by two neighboring wafer support brackets 400. The distance measurement structure 600 can be configured to determine whether the distance between the neighboring wafers 700 meets the requirement and whether the distance between any two neighboring wafers 700 is the same through the detection. In some embodiments, the distance measurement structure can be a laser rangefinder or an ultrasonic rangefinder.

By providing the distance measurement structure 600 at the machine bracket 100, the distance between the wafers 700 carried by the neighboring wafer support brackets 400 can be detected by the distance measurement structure 600. Thus, the distance measurement structure 600 can determine whether the distance between the neighboring wafers 700 meets the requirement through the detected distance. The distance measurement structure 600 can also determine whether the distance between any two neighboring wafers 700 is the same through the detected distance. Thus, the issue that the distance between any two neighboring wafers 700 is not the same can be effectively determined.

Furthermore, the distance measurement structure 600 can include an electric cylinder 610, an electric cylinder sliding piece 620, a through beam sensor bracket 630, and a through beam sensor 640. The electric cylinder 610 can be arranged at the machine bracket. The electric cylinder 610 can extend along the movement direction of the second end 320. The electric cylinder sliding piece 620 can be movably arranged at the electric cylinder 610. In some embodiments, the electric sliding piece 620 can be sleeved at the electric cylinder 610. The electric sliding piece 620 can move relative to the electric cylinder 610. The through beam sensor bracket 630 can be arranged at the electric cylinder sliding piece 620. The through beam sensor bracket 630 can be fixedly mounted at the electric cylinder sliding piece 620. The through beam sensor 640 can be arranged at the through beam sensor bracket 630. The through beam sensor 640 can be configured to detect the distance between the wafers 700 carried by the neighboring wafer support brackets 400.

By providing the electric cylinder 610, the electric cylinder sliding piece 620 can be connected to the electric cylinder 610. Thus, the electric cylinder sliding piece 620 can move at the electric cylinder 610 to cause the through beam sensor bracket 630 connected to the electric cylinder 620 to move together. Thus, the through beam sensors 640 connected to the through beam sensor bracket 630 can move together. Eventually, the through beam sensor 640 can movably detect the distance between all the neighboring wafers 700 to effectively solve the problem of distance detection between any neighboring wafers 700. Meanwhile, through the movement of the electric cylinder sliding piece 620 at the electric cylinder 610, the through beam sensor 640 can move more stably, and the detected distance can be more accurate.

The present disclosure provides a cleaning apparatus, including any one of the wafer transfer devices disclosed in the above embodiments.

The above embodiments of the present disclosure focus on the differences between various embodiments. Different optimized features of the embodiments can be combined to form better embodiments, as long as there is no conflict, which is not repeated here for the sake of brevity.

Embodiments of the present disclosure are described in conjunction with the accompanying drawings. However, the present disclosure is not limited to the specific embodiments above. The specific embodiments above are illustrative and not restrictive. Those of ordinary skill in the art can make many forms without departing from the spirit and the scope of the claims according to the present disclosure, which are within the scope of the present disclosure.

What is claimed is:

1. A wafer transfer device of a wafer cleaning apparatus, comprising:
   a machine bracket;
   a drive mechanism arranged at the machine bracket;
   a retractable bracket arranged at the machine bracket including a sleeve, a first end of the retractable bracket being fixedly connected to the machine bracket, a second end of the retractable bracket being movably arranged at the machine bracket; and
   a plurality of wafer support brackets arranged at the retractable bracket and arranged in a movement direction of the second end, each wafer support bracket of the plurality of wafer support brackets including a bracket pin and a shaft sleeve;
   wherein:
   the drive mechanism is connected to the retractable bracket and configured to drive the second end to move to cause the retractable bracket to extend and retract;
   a distance of any two neighboring wafer support brackets changes as the retractable bracket extends and retracts, and the distance of any two neighboring wafer support brackets is same;

the bracket pin is arranged at a bottom of the wafer support bracket;
the shaft sleeve is rotatably connected to the bracket pin; and
the sleeve is connected to the shaft sleeve.

2. The wafer transfer device according to claim 1, wherein the retractable bracket includes:
a plurality of connection rods hinged end-to-end, wherein:
the plurality of wafer support brackets are connected to middle positions of the plurality of connection rods in a one-to-one correspondence;
connection positions between the plurality of wafer support brackets and the corresponding connection rods are on a straight line; and
the straight line extends in a movement direction of the second end.

3. The wafer transfer device according to claim 1, wherein:
a screw mechanism is provided at the machine bracket;
the screw mechanism includes:
a screw connected to the machine bracket and connected to the drive mechanism for driving, an axis of the screw extending in the movement direction of the second end; and
a sliding piece arranged at the screw and thread-cooperates with the screw;
wherein:
the drive mechanism is configured to drive the screw to rotate to cause the sliding piece to move on the screw;
the sliding piece is connected to the second end; and
the second end moves with the sliding piece along the screw.

4. The wafer transfer device according to claim 3, wherein the drive mechanism includes:
a motor arranged at the machine bracket; and
a transmission member;
wherein the motor is connected to the screw through the transmission member for transmitting movement to drive the screw to rotate.

5. The wafer transfer device according to claim 3, wherein:
the machine bracket further includes a guide rod, an axis of the guide rod extending along the movement direction of the second end; and
the wafer support bracket includes a guide hole, the plurality of wafer support brackets being arranged at the guide rod through the guide hole, and the guide rod slidably cooperating with the guide hole.

6. The wafer transfer device according to claim 5, further comprising:
two guide rods arranged on two sides of the screw, respectively;
wherein the wafer support bracket includes two guide holes cooperating with the two guide rods in a one-to-one correspondence.

7. The wafer transfer device according to claim 3, wherein the wafer support bracket includes an avoidance hole, the screw passing through avoidance holes of the plurality of wafer support brackets to be connected to the machine bracket.

8. The wafer transfer device according to claim 1, wherein the machine bracket further includes:
a first position sensor and
a second position sensor spaced apart from the first position sensor on the machine bracket;
wherein:
in response to the second end moving to a position opposite to the first position sensor, the first position sensor is triggered, and a distance between any two neighboring wafer support brackets is a first distance; and
in response to the second end moving to a position opposite to the second position sensor, the second position sensor is triggered, and the distance between any two neighboring wafer support brackets is the second distance; and
the first distance is not equal to the second distance.

9. The wafer transfer device according to claim 1, further comprising:
a distance measurement structure arranged at the machine bracket and configured to detect a distance between wafers carried by the two neighboring wafer support brackets.

10. The wafer transfer device according to claim 9, wherein the distance measurement structure includes:
an electric cylinder arranged at the machine bracket and along the movement direction of the second end;
an electric cylinder sliding piece movably arranged at the electric cylinder;
a through beam sensor bracket arranged at the electric cylinder sliding piece; and
a through beam sensor arranged at the through beam sensor bracket and configured to detect the distance between the wafers carried by neighboring wafer support brackets.

11. A wafer cleaning apparatus comprising a wafer transfer device including:
a machine bracket;
a drive mechanism arranged at the machine bracket;
a retractable bracket arranged at the machine bracket including a sleeve, a first end of the retractable bracket being fixedly connected to the machine bracket, a second end of the retractable bracket being movably arranged at the machine bracket; and
a plurality of wafer support brackets arranged at the retractable bracket and arranged in a movement direction of the second end, each wafer support bracket of the plurality of wafer support brackets including a bracket pin and a shaft sleeve;
wherein:
the drive mechanism is connected to the retractable bracket and configured to drive the second end to move to cause the retractable bracket to extend and retract;
a distance of any two neighboring wafer support brackets changes as the retractable bracket extends and retracts, and the distance of any two neighboring wafer support brackets is same;
the bracket pin is arranged at a bottom of the wafer support bracket;
the shaft sleeve is rotatably connected to the bracket pin; and
the sleeve is connected to the shaft sleeve.

\* \* \* \* \*